US012731644B2

(12) United States Patent
Liu et al.

(10) Patent No.: US 12,731,644 B2
(45) Date of Patent: Sep. 8, 2026

(54) PROGRAM OPERATIONS IN MEMORY DEVICES

(71) Applicant: Yangtze Memory Technologies Co., Ltd., Wuhan (CN)

(72) Inventors: Hongtao Liu, Wuhan (CN); Pengyu Xu, Wuhan (CN); Ying Huang, Wuhan (CN); Lei Guan, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 89 days.

(21) Appl. No.: 18/789,613

(22) Filed: Jul. 30, 2024

(65) Prior Publication Data

US 2025/0308594 A1 Oct. 2, 2025

Related U.S. Application Data

(63) Continuation of application No. PCT/CN2024/084030, filed on Mar. 27, 2024.

(51) Int. Cl.
*G11C 16/04* (2006.01)
*G11C 16/10* (2006.01)
*G11C 16/24* (2006.01)

(52) U.S. Cl.
CPC .......... *G11C 16/10* (2013.01); *G11C 16/0483* (2013.01); *G11C 16/24* (2013.01)

(58) Field of Classification Search
CPC ..... G11C 16/10; G11C 16/0483; G11C 16/24; G11C 11/5628; G11C 2211/5621; G11C 16/32; G11C 16/3427; G11C 16/3459
See application file for complete search history.

(56) References Cited

U.S. PATENT DOCUMENTS

2013/0250687 A1 9/2013 Chan
2017/0062054 A1 3/2017 Maeda
2017/0178739 A1 6/2017 Maejima et al.
2022/0084597 A1* 3/2022 Mun .................. G11C 11/5671
2024/0004572 A1* 1/2024 Joo ....................... G11C 16/14

FOREIGN PATENT DOCUMENTS

WO WO 2019147326 8/2019

OTHER PUBLICATIONS

International Search Report in International Appln. No. PCT/CN2024/084030, mailed on Aug. 26, 2024, 3 pages.
Communication pursuant to Article 94(3) EPC in European Appln. No. 24730540.2, mailed on Apr. 15, 2026, 5 pages.

* cited by examiner

*Primary Examiner* — Mohammed A Bashar
(74) *Attorney, Agent, or Firm* — Fish & Richardson P.C.

(57) ABSTRACT

Example memory devices, systems, and methods for reducing program disturbance in memory devices are disclosed. One example method includes during an n-th loop of a program operation performed on a first memory cell in a memory cell array, applying a first voltage to a first bit line coupled to a second memory cell in the memory cell array, where the first memory cell and the second memory cell are coupled to a first word line. The first bit line is discharged to decrease a voltage of the first bit line from the first voltage to a second voltage, where the second voltage is lower than the first voltage. After the first voltage is applied to the first bit line, a second bit line is set to floating, where the second bit line is coupled to the first memory cell.

20 Claims, 11 Drawing Sheets

PROGRAM OPERATIONS IN MEMORY DEVICES

CROSS-REFERENCE TO RELATED APPLICATIONS

This application is a continuation of International Application No. PCT/CN2024/084030, filed on Mar. 27, 2024, the disclosure of which is hereby incorporated by reference in its entirety.

TECHNICAL FIELD

The present disclosure relates to memory devices, systems, and methods for program operations (also referred to as programming operations) in memory devices.

BACKGROUND

Flash memory is a low-cost, high-density, nonvolatile solid-state storage medium that can be electrically erased and reprogrammed. Flash memory includes NOR flash memory and NAND flash memory. Various operations can be performed by a flash memory, for example, program (write) and erase operations, to change the threshold voltage of each memory cell to a respective level. For NAND flash memory, an erase operation can be performed at the block level.

SUMMARY

The present disclosure relates to memory devices, systems, and methods for program operations in memory devices.

Certain aspects of the subject matter described here can be implemented as a memory device. The memory device includes a memory cell array and a peripheral circuit coupled to the memory cell array and configured to: during an n-th loop of a program operation performed on a first memory cell in the memory cell array: apply a first voltage to a first bit line coupled to a second memory cell in the memory cell array, where the first memory cell and the second memory cell are coupled to a first word line; discharge the first bit line to decrease a voltage of the first bit line from the first voltage to a second voltage, where the second voltage is lower than the first voltage; and after the first voltage is applied to the first bit line, set a second bit line to floating, where the second bit line is coupled to the first memory cell.

The memory device can include one or more of the following features.

In some implementations, the peripheral circuit is further configured to: during an (n−i)-th loop and an (n−j)-th loop of the program operation, apply a same voltage to the first word line, where i and j are two integers that are greater than zero and less than n, and i is greater than j.

In some implementations, the peripheral circuit is further configured to: during a loop before the (n−i)-th loop of the program operation, apply the second voltage to the first bit line; and apply a program voltage to the first word line coupled to the first memory cell, where the program voltage is smaller than the same voltage applied during the (n−i)-th loop and the (n−j)-th loop.

In some implementations, a programming state of the first memory cell is the highest programming state among programming states of memory cells in the memory cell array.

In some implementations, the second voltage is an inhibit voltage applied to the first bit line to inhibit programming of the second memory cell.

In some implementations, the peripheral circuit is further configured to: during the n-th loop, apply a third voltage to a first select gate line coupled to a first select gate transistor to turn on the first select gate transistor, where the first memory cell and the first select gate transistor are coupled to the second bit line.

In some implementations, the peripheral circuit is further configured to apply a fourth voltage to a second select gate line coupled to a second select gate transistor to turn off the second select gate transistor, where a third memory cell and the second select gate transistor are coupled to the second bit line, and the fourth voltage is lower than the third voltage.

In some implementations, the fourth voltage is a negative voltage.

In some implementations, the n-th loop is the last loop of the program operation.

In some implementations, the peripheral circuit is further configured to apply, during an (n−1)-th loop of the program operation, a fifth voltage to the first bit line, where the fifth voltage is lower than the first voltage.

In some implementations, a difference between the fifth voltage and the first voltage is the same as or larger than a program voltage difference between the n-th loop and the (n−1)-th loop of the program operation.

In some implementations, the peripheral circuit is further configured to apply, during an (n−2)-th loop of the program operation, a sixth voltage to the first bit line, where the sixth voltage is lower than the fifth voltage, and a difference between the fifth voltage and the sixth voltage is lower than or equal to a difference between the first voltage and the fifth voltage.

In some implementations, the same voltage is applied to the first word line during last two or more loops of the program operation.

Certain aspects of the subject matter described here can be implemented as a method. The method includes: during an n-th loop of a program operation performed on a first memory cell in a memory cell array: applying a first voltage to a first bit line coupled to a second memory cell in the memory cell array, where the first memory cell and the second memory cell are coupled to a first word line; discharging the first bit line to decrease a voltage of the first bit line from the first voltage to a second voltage, where the second voltage is lower than the first voltage; and after the first voltage is applied to the first bit line, setting a second bit line to floating, where the second bit line is coupled to the first memory cell.

The method can include one or more of the following features.

In some implementations, the method further includes: during an (n−i)-th loop and an (n−j)-th loop of the program operation, applying a same voltage to the first word line, where i and j are two integers that are greater than zero and less than n, and i is greater than j.

In some implementations, the method further includes: during a loop before the (n−i)-th loop of the program operation: applying the second voltage to the first bit line; and applying a program voltage to the first word line coupled to the first memory cell, where the program voltage is smaller than the same voltage applied during the (n−i)-th loop and the (n−j)-th loop.

In some implementations, a programming state of the first memory cell is the highest programming state among programming states of memory cells in the memory cell array.

In some implementations, the second voltage is an inhibit voltage applied to the first bit line to inhibit programming of the second memory cell.

In some implementations, the method further includes: during the n-th loop, applying a third voltage to a first select gate line coupled to a first select gate transistor to turn on the first select gate transistor, where the first memory cell and the first select gate transistor are coupled to the second bit line.

In some implementations, the method further includes applying a fourth voltage to a second select gate line coupled to a second select gate transistor to turn off the second select gate transistor, where a third memory cell and the second select gate transistor are coupled to the second bit line, and the fourth voltage is lower than the third voltage.

In some implementations, the fourth voltage is a negative voltage.

In some implementations, the n-th loop is the last loop of the program operation.

In some implementations, the method further includes applying, during an (n−1)-th loop of the program operation, a fifth voltage to the first bit line, where the fifth voltage is lower than the first voltage.

In some implementations, a difference between the fifth voltage and the first voltage is the same as or larger than a program voltage difference between the n-th loop and the (n−1)-th loop of the program operation.

In some implementations, the method further includes applying, during an (n−2)-th loop of the program operation, a sixth voltage to the first bit line, where the sixth voltage is lower than the fifth voltage, and a difference between the fifth voltage and the sixth voltage is lower than or equal to a difference between the first voltage and the fifth voltage.

In some implementations, the same voltage is applied to the first word line during last two or more loops of the program operation.

Certain aspects of the subject matter described here can be implemented as a memory system. The memory system includes a memory device and a controller coupled to the memory device and configured to initiate operations. The memory device includes a memory cell array and a peripheral circuit coupled to the memory cell array and configured to perform the operations including: during an n-th loop of a program operation performed on a first memory cell in the memory cell array: applying a first voltage to a first bit line coupled to a second memory cell in the memory cell array, where the first memory cell and the second memory cell are coupled to a first word line; discharging the first bit line to decrease a voltage of the first bit line from the first voltage to a second voltage, where the second voltage is lower than the first voltage; and after the first voltage is applied to the first bit line, setting a second bit line to floating, where the second bit line is coupled to the first memory cell.

The memory system can include one or more of the following features.

In some implementations, the operations further include: during an (n−i)-th loop and an (n−j)-th loop of the program operation, applying a same voltage to the first word line, where i and j are two integers that are greater than zero and less than n, and i is greater than j.

In some implementations, the operations further include: during a loop before the (n−i)-th loop of the program operation: applying the second voltage to the first bit line; and applying a program voltage to the first word line coupled to the first memory cell, where the program voltage is smaller than the same voltage applied during the (n−i)-th loop and the (n−j)-th loop.

In some implementations, a programming state of the first memory cell is the highest programming state among programming states of memory cells in the memory cell array.

In some implementations, the second voltage is an inhibit voltage applied to the first bit line to inhibit programming of the second memory cell.

In some implementations, the operations further include: during the n-th loop, applying a third voltage to a first select gate line coupled to a first select gate transistor to turn on the first select gate transistor, where the first memory cell and the first select gate transistor are coupled to the second bit line.

In some implementations, the operations further include applying a fourth voltage to a second select gate line coupled to a second select gate transistor to turn off the second select gate transistor, where a third memory cell and the second select gate transistor are coupled to the second bit line, and the fourth voltage is lower than the third voltage.

In some implementations, the fourth voltage is a negative voltage.

In some implementations, the n-th loop is the last loop of the program operation.

In some implementations, the operations further include applying, during an (n−1)-th loop of the program operation, a fifth voltage to the first bit line, where the fifth voltage is lower than the first voltage.

In some implementations, a difference between the fifth voltage and the first voltage is the same as or larger than a program voltage difference between the n-th loop and the (n−1)-th loop of the program operation.

In some implementations, the operations further include applying, during an (n−2)-th loop of the program operation, a sixth voltage to the first bit line, where the sixth voltage is lower than the fifth voltage, and a difference between the fifth voltage and the sixth voltage is lower than or equal to a difference between the first voltage and the fifth voltage.

In some implementations, the same voltage is applied to the first word line during last two or more loops of the program operation.

The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

Like reference numbers and designations in the various drawings indicate like elements.

DETAILED DESCRIPTION

Figure 1:
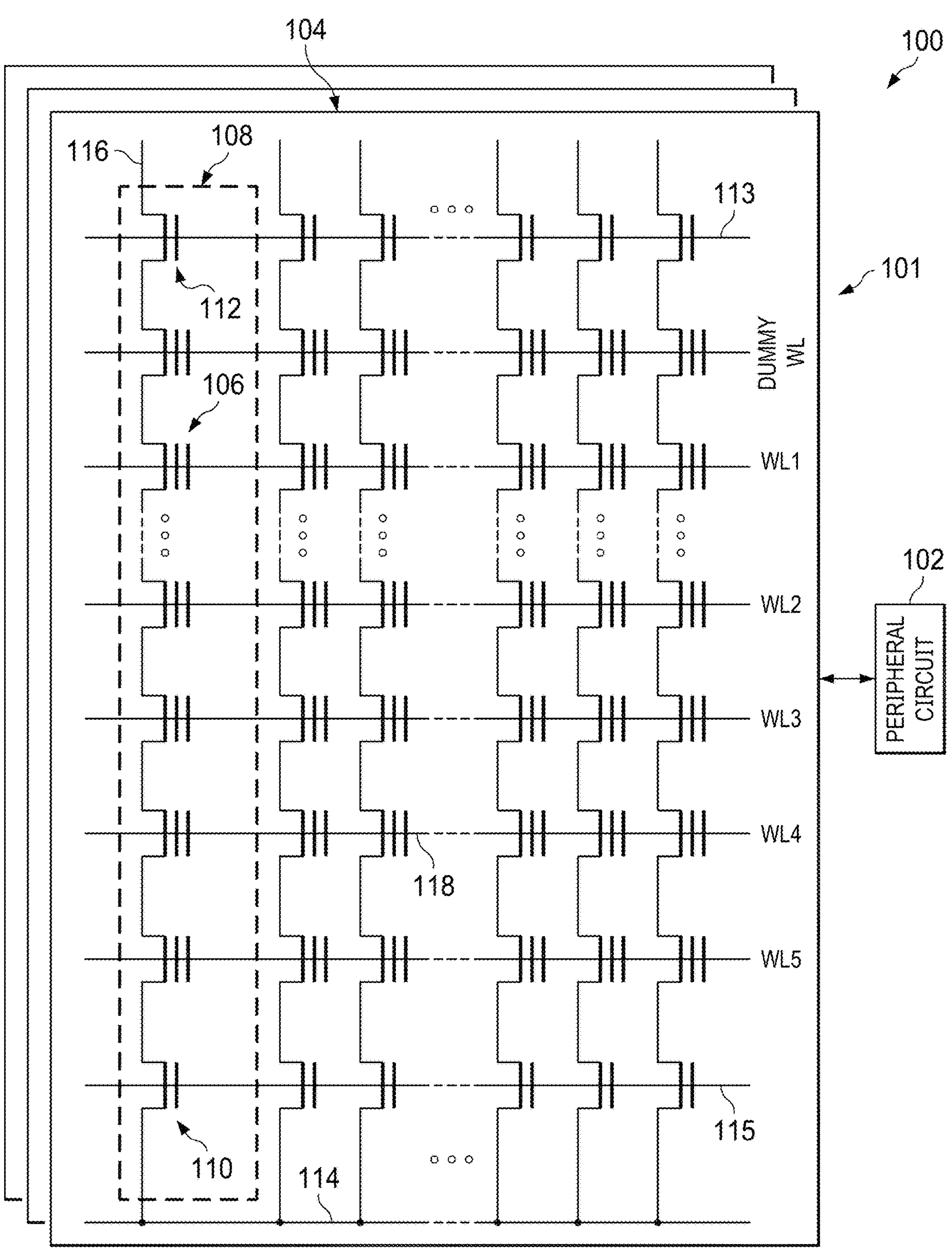
FIG. 1 illustrates an example of a schematic circuit diagram of a memory device including peripheral circuits, according to some aspects of the present disclosure.

This specification relates to memory devices, systems, and methods for improving program operations of memory devices, for example, by reducing program disturbance to memory cells that are not selected for programming, when a program operation is performed on another memory cell. In some cases, the increased number of layers in a three-dimensional (3D) NAND flash memory can lead to increased program disturbance to memory cells that are not selected for programming, when another memory cell is being programmed. Consequently, the read windows of the memory cells not selected for programming become narrower, and the performance of the 3D NAND flash memory is degraded.

In some cases, a program operation performed on a memory cell can be an incremental step pulse program (ISPP) operation that includes a series of program loops. The programming voltage increases from one program loop to the next during the program operation. Therefore the respective programming voltage in each program loop continues to increase towards the end of the program operation, and the higher programming voltage in each of the program loops at a later phase of the program operation can lead to larger difference between the control gate voltage and the channel potential of a memory cell not selected for programming (also referred to as an unselected cell or an inhibit cell). The larger difference between the control gate voltage and the channel potential can introduce programming effect on the inhibit cell, and therefore increase the threshold voltage of the inhibit cell, thus causing program disturbance to the inhibit cell.

In some implementations, to reduce the aforementioned program disturbance, the respective programming voltage in each of the last couple of program loops can be kept constant across the last couple of program loops, in order to prevent the programming voltage from continuing to increase from one program loop to the next. Therefore, the program disturbance described above can be reduced. But preventing the programming voltage from continuing to increase from one program loop to the next can negatively impact the programming efficiency of the memory cell being programmed.

In some implementations, to maintain the programming efficiency of the memory cell being programmed during a program loop, a voltage higher than an inhibit voltage can be applied, at the beginning of a program loop, to a bit line coupled to memory cells that are not selected for programming (e.g., an unselected bit line), and then the unselected bit line is discharged such that its voltage is reduced to the inhibit voltage. This voltage transition in the unselected bit line can reduce the floating voltage of a bit line coupled to the memory cell being programmed (e.g., a selected bit line), due to the coupling effect between the selected bit line and the unselected bit line. The reduced voltage of the selected bit line can then reduce the channel potential of a memory string containing the memory cell being programmed, due to the connection between the channel of the memory string and the selected bit line. Therefore, the difference between the channel potential of the memory string and the voltage of the control gate of the memory cell being programmed is increased, thus maintaining the programming efficiency of the memory cell being programmed.

Implementations of the present disclosure can provide one or more of the following technical effects. For example, program disturbance to memory cells not selected for programming can be reduced. The read windows between threshold voltage distributions can be increased. The performance of the memory device can be improved, without reducing the programming efficiency of the memory cell being programmed. Additionally, the described techniques can be implemented with only limited hardware changes to achieve benefits of improved performances such as increased read windows between threshold voltage distributions.

FIG. 1 illustrates an example of a schematic circuit diagram of a memory device 100 including peripheral circuits, according to some aspects of the present disclosure. Memory device 100 can include a memory cell array 101 and peripheral circuits 102 coupled to memory cell array 101. Memory cell array 101 can be a NAND Flash memory cell array in which memory cells 106 are provided in the form of an array of NAND memory strings 108 each extending vertically above a substrate (not shown). In some implementations, each NAND memory string 108 includes a plurality of memory cells 106 coupled in series and stacked vertically. Each memory cell 106 can hold a continuous, analog value, such as an electrical voltage or charge that depends on the number of electrons trapped within a region of memory cell 106. Each memory cell 106 can be either a floating gate type of memory cell including a floating-gate transistor or a charge trap type of memory cell including a charge-trap transistor.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1 each NAND memory string 108 can include a source select gate (SSG) 110 at its source end and a drain select gate (DSG) 112 at its drain end. SSG 110 and DSG 112 can be configured to activate selected NAND memory strings 108 (columns of the array) during read and program operations. In some implementations, the sources of NAND memory strings 108 in the same block 104 are coupled through a same source line (SL) 114, e.g., a common SL. In other words, all NAND memory strings 108 in the same block 104 have an array common source (ACS), according to some implementations. DSG 112 of each NAND memory string 108 is coupled to a respective bit line 116 from which data can be read or written via an output bus (not shown), according to some implementations. In some implementations, each NAND memory string 108 is configured to be selected or deselected by applying a select voltage or a deselect voltage (e.g., 0 V) to respective DSG 112 through one or more DSG lines 113, and/or by applying a select voltage or a deselect voltage (e.g., 0 V) to respective SSG 110 through one or more SSG lines 115.

As shown in FIG. 1, NAND memory strings 108 can be organized into multiple blocks 104, each of which can have a common source line 114, e.g., coupled to the ACS. In some implementations, each block 104 is the basic data unit for erase operations, i.e., all memory cells 106 on the same block 104 are erased at the same time. To erase memory cells 106 in a selected block 104, source lines 114 coupled to selected block 104 as well as unselected blocks 104 in the same plane as selected block 104 can be biased with an erase voltage (Vers), such as a high positive voltage (e.g., 20 V or more). In some examples, erase operation may be performed at a half-block level, a quarter-block level, or a level having any suitable number of blocks or any suitable fractions of a block. Memory cells 106 of adjacent NAND memory strings can be coupled through word lines 118 that select which row of memory cells 106 is affected by read and program operations. Each word line 118 can include a plurality of control gates (gate electrodes) at each memory cell 106 and a gate line coupling the control gates. Example word lines (WLs) shown in FIG. 1 include dummy WL, WL1, WL2, WL3, WL4, and WL5 that are between one or more DSG lines 113 and one or more SSG lines 115.

Figure 2:
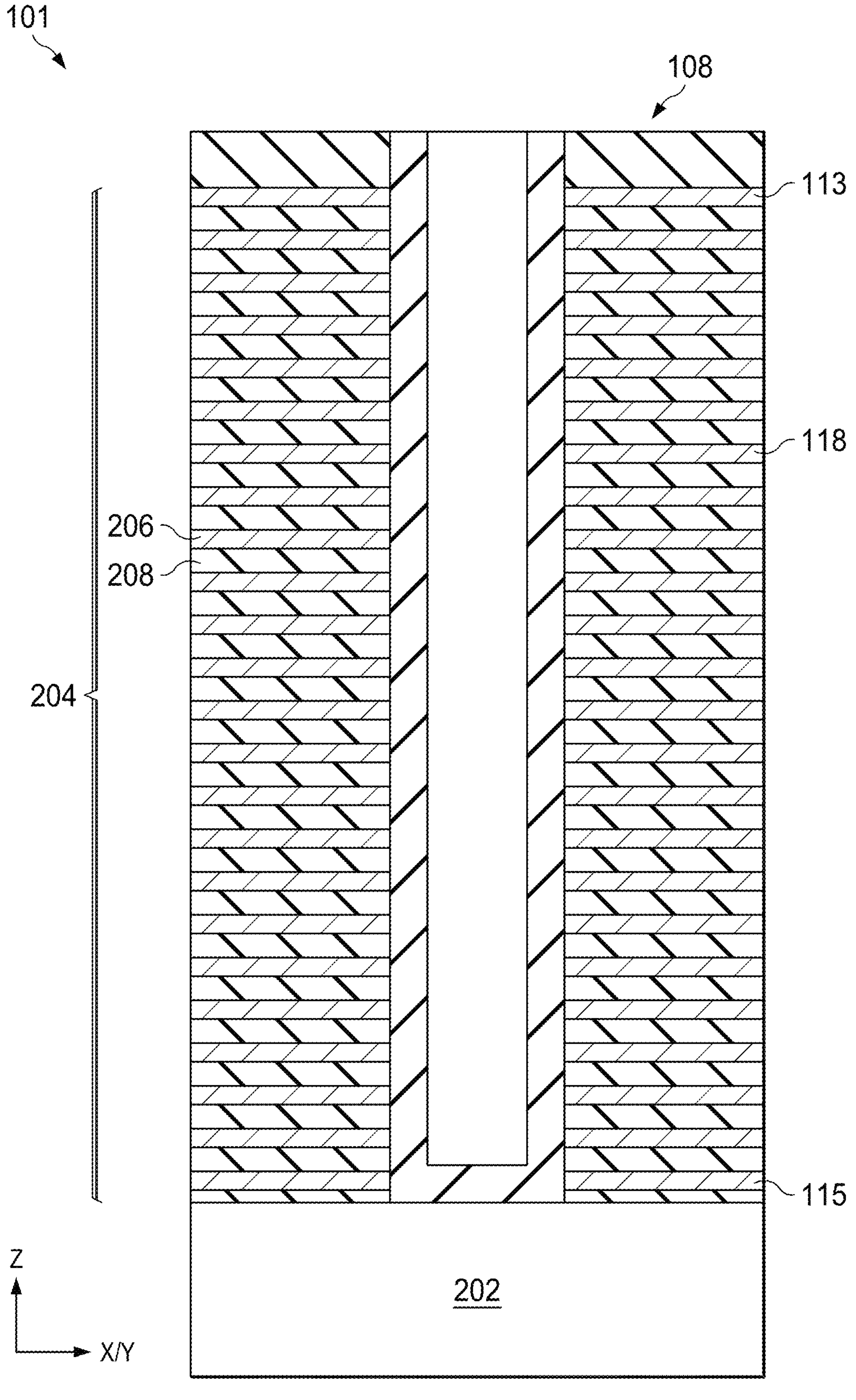
FIG. 2 illustrates an example of a side view of cross-sections of a memory cell array including NAND memory strings, according to some aspects of the present disclosure.

FIG. 2 illustrates an example of a side view of cross-sections of a memory cell array 101 including NAND memory strings 108, according to some aspects of the present disclosure. As shown in FIG. 2, NAND memory string 108 can extend vertically through a memory stack 204 above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 204 can include interleaved gate conductive layers 206 and gate-to-gate dielectric layers 208. The number of the pairs of gate conductive layers 206 and gate-to-gate dielectric layers 208 in memory stack 204 can determine the number of memory cells 106 in memory cell array 101. Gate conductive layer 206 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer 206 can include control gates surrounding the memory cells 106, DSG 112, or SSG 110, and can extend laterally as DSG line 113 at the top of memory stack 204, SSG line 115 at the bottom of memory stack 204, or word line 118 between DSG line 113 and SSG line 115.

Figure 3:
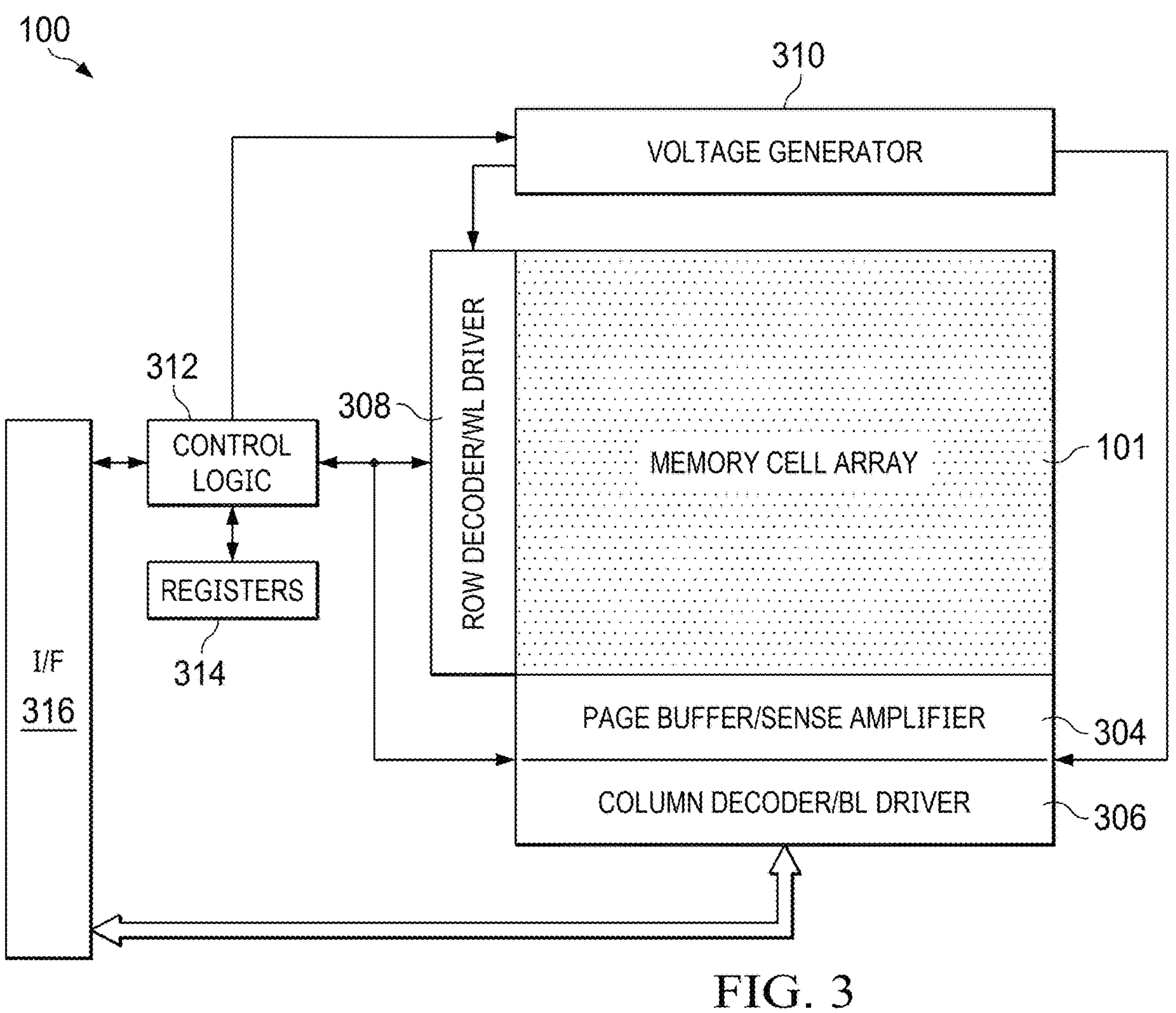
FIG. 3 illustrates an example of transactions between a host and a device, according to some aspects of the present disclosure.

Peripheral circuits 102 can be coupled to memory cell array 101 through bit lines 116, word lines 118, source lines 114, SSG lines 115, and DSG lines 113. Peripheral circuits 102 can include any suitable analog, digital, and mixed-signal circuits for facilitating the operations of memory cell array 101 by applying and sensing voltage signals and/or current signals to and from each target memory cell of the memory cells 106 through bit lines 116, word lines 118, source lines 114, SSG lines 115, and DSG lines 113. Peripheral circuits 102 can include various types of peripheral circuits formed using metal-oxide-semiconductor (MOS) technologies. For example, FIG. 3 illustrates some example peripheral circuits, according to some aspects of the present disclosure. The example peripheral circuits include a page buffer/sense amplifier 304, a column decoder/bit line driver 306, a row decoder/word line driver 308, a voltage generator 310, control logic 312, registers 314, an interface 316, and a data bus. In some examples, additional peripheral circuits not shown in FIG. 3 may be included as well.

Page buffer/sense amplifier 304 can be configured to read and program (write) data from and to memory cell array 101 according to the control signals from control logic 312. In one example, page buffer/sense amplifier 304 may store one page of program data (write data) to be programmed into one page of memory cell array 101. In another example, page buffer/sense amplifier 304 may perform program verify operations to ensure that the data has been properly programmed into memory cells 106 coupled to selected word lines 118. In still another example, page buffer/sense amplifier 304 may also sense the low power signals from bit line 116 that represents a data bit stored in memory cell 106 and amplify the small voltage swing to recognizable logic levels in a read operation. Column decoder/bit line driver 306 can be configured to be controlled by control logic 312 and select one or more NAND memory strings 108 by applying bit line voltages generated from voltage generator 310.

Row decoder/word line driver 308 can be configured to be controlled by control logic 312 and select/deselect blocks 104 of memory cell array 101 and select/deselect word lines 118 of block 104. Row decoder/word line driver 308 can be further configured to drive word lines 118 using word line voltages generated from voltage generator 310. In some implementations, row decoder/word line driver 308 can also select/deselect and drive SSG lines 115 and DSG lines 113 as well. Row decoder/word line driver 308 can be configured to apply a read voltage to selected word line 118 in a read operation on memory cell 106 coupled to selected word line 118.

Voltage generator 310 can be configured to be controlled by control logic 312 and generate the word line voltages (e.g., read voltage, program voltage, pass voltage, local voltage, verification voltage, etc.), bit line voltages, and source line voltages to be supplied to memory cell array 101.

Control logic 312 can be coupled to each peripheral circuit described above and configured to control operations of each peripheral circuit. Registers 314 can be coupled to control logic 312 and include status registers, command registers, and address registers for storing status information, command operation codes (OP codes), and command addresses for controlling the operations of each peripheral circuit. The status registers of registers 314 can include one or more registers configured to store open block information indicative of the open block(s) of all blocks 104 in memory cell array 101, such as having an auto dynamic start voltage (ADSV) list. In some implementations, the open block information is also indicative of the last programmed page of each open block.

Interface 316 can be coupled to control logic 312 and act as a control buffer to buffer and relay control commands received from a host (not shown) to control logic 312 and status information received from control logic 312 to the host. Interface 316 can also be coupled to column decoder/bit line driver 306 via a data bus and act as a data input/output (I/O) interface and a data buffer to buffer and relay the data to and from memory cell array 101.

Figure 4:
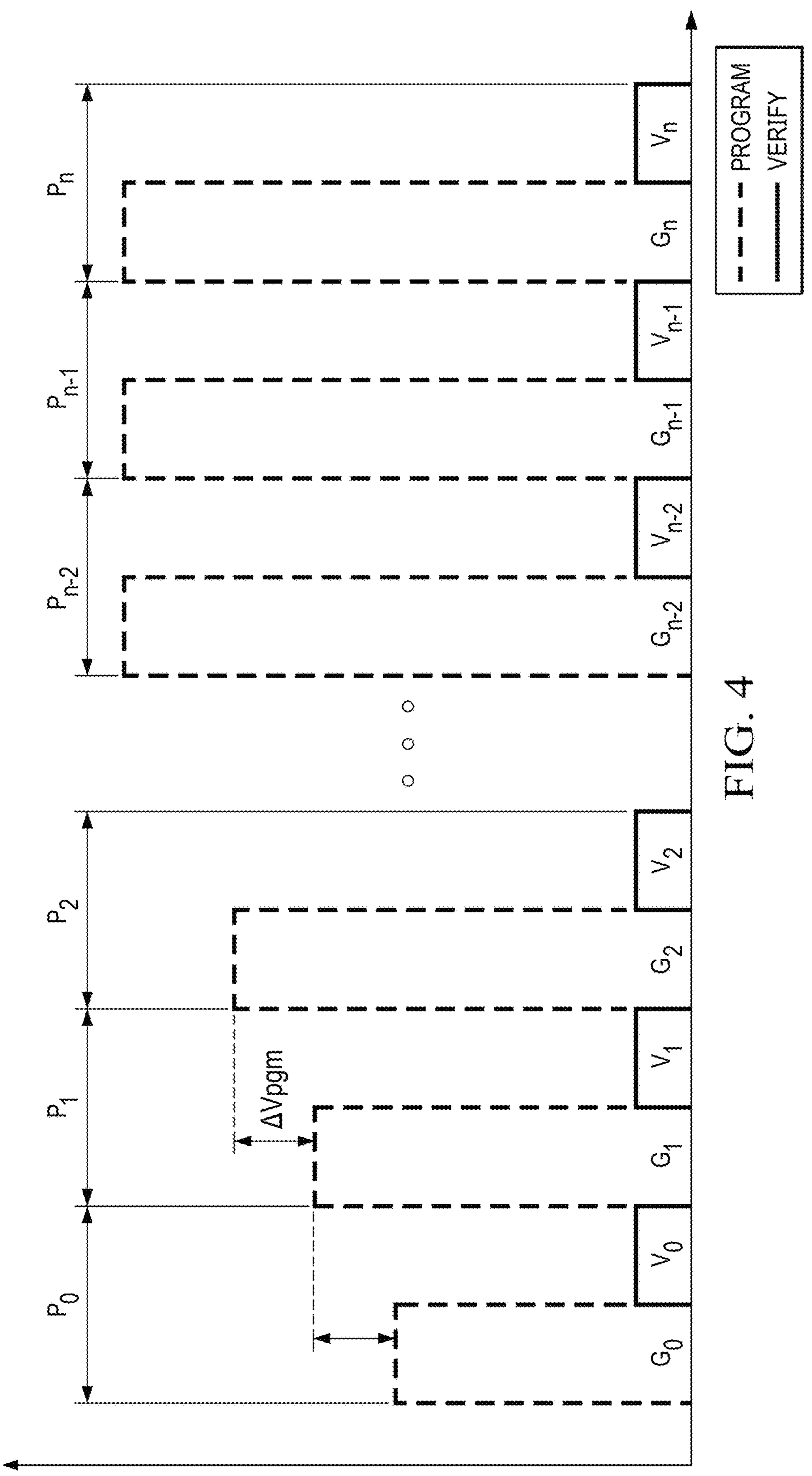
FIG. 4 illustrates example pulses applied to a word line coupled to a memory cell selected for a program operation, according to some aspects of the present disclosure.

FIG. 4 illustrates example pulses applied to a word line coupled to a memory cell selected for a program operation, according to some aspects of the present disclosure. An example of the program operation is an ISPP operation that includes a series of loops, for example, $P_1$ to $P_n$. Each loop (e.g., $P_1$) includes a program pulse (e.g., $G_1$) with a programming voltage applied to a word line coupled to a memory cell to program the memory cell to a threshold voltage. Each loop (e.g., $P_1$) also includes one or more verify pulses (e.g., $V_1$) following the program pulse in the same loop to verify that the memory cell has been programmed to the threshold voltage. In some implementations, the loop can be referred to as a program/verify loop or a program loop. Example program pulses $G_1$ to $G_n$ and example verify pulses $V_1$ to $V_1$ are shown in FIG. 4. During an early phase of the program operation, for example, among program loops $P_1$ to $P_{n-3}$ that contain $G_1$ to $G_{n-3}$ respectively, the programming voltages of the program pulses increase by ΔVpgm between consecutive program pulses. ΔVpgm can be the same or different between different consecutive program pulses. During a late phase of the program operation, for example, among the last couple of program loops (e.g., program loops $P_{n-2}$ to $P_1$ that contain $G_{n-2}$ to $G_n$ respectively), the programming voltages can be kept constant. In some implementations, the constant programming voltages kept among the last couple of program loops can reduce the program disturbance to memory cells that are not selected for programming.

Figure 5:
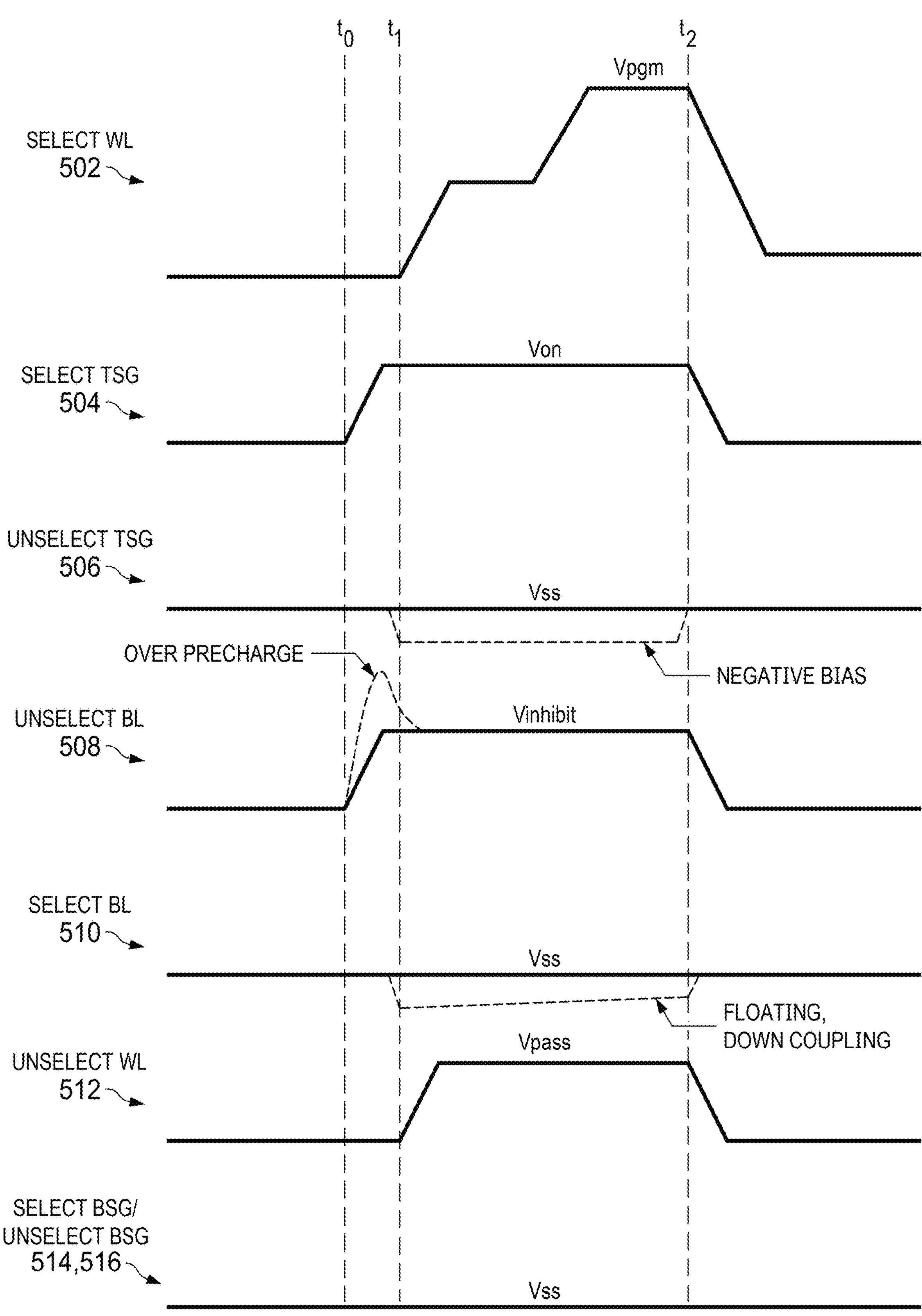
FIG. 5 illustrates example voltages of components in a memory cell array during a program loop of a memory cell in the memory cell array, according to some aspects of the present disclosure.

FIG. 5 illustrates example voltages of components in a memory cell array during a program loop of a memory cell in the memory cell array, according to some aspects of the present disclosure. In some implementations, select word line (sel. WL) 502 represents a word line (e.g., first word line) coupled to a memory cell (e.g., first memory cell) selected for a program operation. As described in FIG. 4, the program operation can include one or more program loops, for example, $P_1$ to $P_1$. An example of sel. WL 502 can be word line 118 in FIG. 1. Unselect word line (Unsel. WL) 512 represents a word line that is not coupled to any memory cells selected for a program operation. An example of unsel. WL 512 can be word line 118 in FIG. 1. Sel. TSG 504 (e.g., first select gate line) represents a select gate line, for example, DSG line 113, coupled to one or more select gate transistors (e.g., first select gate transistor) that are turned on, for example, DSG 112 in FIG. 1, in a memory cell block. Unsel. TSG 506 represents a select gate line coupled to one or more select gate transistors (e.g., second select gate transistor) that are turned off, as well as one or more memory cells (e.g., a third memory cell) that are not selected for programming. Each of sel. BSG 514 and unsel. BSG 516 represents a bottom select gate line, for example, SSG line 115, that is coupled to one or more select gate transistors, for example, SSG 110 (e.g., source select gate transistor) in FIG. 1, in a memory cell block. Sel. BL 510 (e.g., second bit line) represents a bit line coupled to a memory string that includes a memory cell selected for a program operation. Unsel. BL 508 (e.g., first bit line) represents a bit line coupled to one or more memory strings that do not include any memory cells selected for a program operation. In some cases, the one or more select gate transistors and the one or more memory cells coupled to unsel. TSG 506 are also coupled to sel. BL 510.

In some implementations, during a program loop (e.g., between to and $t_2$ in FIG. 5) of a program operation, sel. TSG 504 can be applied a voltage Von (e.g., third voltage) to turn on one or more select gate transistors coupled to sel. TSG 504 and to a memory cell selected for the program operation. In some cases, the one or more select gate transistors and the memory cell selected for the program operation are coupled to sel. BL 510.

In some implementations, a voltage (e.g., fourth voltage) Vss can be applied to unsel. TSG 506 (e.g., second select gate line) during the program loop to turn off one or more select gate transistors coupled to unsel. TSG 506 and to memory cells not selected for the program operation. An example value of Vss can be 0V or another value. In some cases, a negative bias voltage (e.g., the dashed line for unsel. TSG 506 in FIG. 5) can be applied to unsel. TSG 506 during the program loop to turn off the one or more select gate transistors coupled to unsel. TSG 506. In some cases, Vss is lower than Von.

In some implementations, each of sel. BSG 514 and unsel. BSG 516 can be applied a voltage Vss during the program operation to turn off one or more select gate transistors coupled to sel. BSG 514 or unsel. BSG 516.

FIG. 5 shows two implementations for voltage applied to unsel. BL 508 during a program loop, depending on where the program loop is during the program operation.

In one implementation, if the program loop is in an early phase of the program operation, for example, the program loop is one of $P_1, \ldots, P_{n-3}$ described in FIG. 4, a voltage of Vinhibit is applied to unsel. BL 508 during the program loop (e.g., between to and $t_2$) to inhibit programming of every memory cell (e.g., second memory cell) coupled to unsel. BL 508. Because sel. BSG 514 and unsel. BSG 516 are both applied Vss, and unsel. TSG 506 is applied Vss or a negative bias voltage, a memory string (e.g., an unselected string) that does not contain any memory cells selected for the program operation has floating channel potential, which is close to voltage Vpass applied to unsel. WL 512. An example range of Vpass is between 5V and 12V.

In another implementation, if the program loop is in a later phase of the program operation, for example, the program loop is one of $P_{n-2}$ (e.g., (n−j)-th loop), $P_{n-1}$ (e.g., (n−i)-th loop), and $P_1$ (e.g., n-th loop) described in FIG. 4, an over precharge voltage (e.g., first voltage) higher than Vinhibit is first applied to unsel. BL 508 at the beginning of the program loop, for example, at to. Then unsel. BL 508 is discharged to Vinhibit (e.g., second voltage) after to, as shown in the dashed line of unsel. BL 508 in FIG. 5. In some implementations, Sel. BL 510 is set to floating. When the voltage higher than Vinhibit is first applied to unsel. BL 508 at the beginning of the program loop, for example, at to, sel. BL 510 has floating voltage of Vss. When unsel. BL 508 is discharged to Vinhibit after t0, the floating voltage of sel. BL 510 is down coupled to a negative voltage, as shown in the dashed line of sel. BL 510 in FIG. 5, due to the coupling effect between unsel. BL 508 and sel. BL 510. Because the one or more select gate transistors coupled to sel. TSG 504 are turned on, the channel potential of a memory string (e.g., a selected string) coupled to the memory cell selected for the program operation is down coupled to a negative voltage corresponding to the negative voltage of sel. BL 510, due to the coupling effect between the channel of the selected string and sel. BL 510.

In some implementations, during a program loop of the program operation and after a voltage higher than Vinhibit is applied, starting at $t_1$, to unsel. BL 508 at to, one or more programming voltages, including Vpgm, are applied to sel. WL 502 as part of the program operation to program the memory cell.

In some implementations, during a program loop of the program operation and after a voltage higher than Vinhibit is applied, starting at $t_1$, to unsel. BL 508 at to, a voltage Vpass is applied to unsel. WL 512 that is not coupled to any memory cells selected for a program operation.

In some implementations, both the memory cell selected for the program operation and a memory cell not selected for programming can be coupled to sel. WL 502.

In some implementations, the programming state of the memory cell selected for programming is the highest programming state among programming states of memory cells in the memory cell array.

Figure 6:
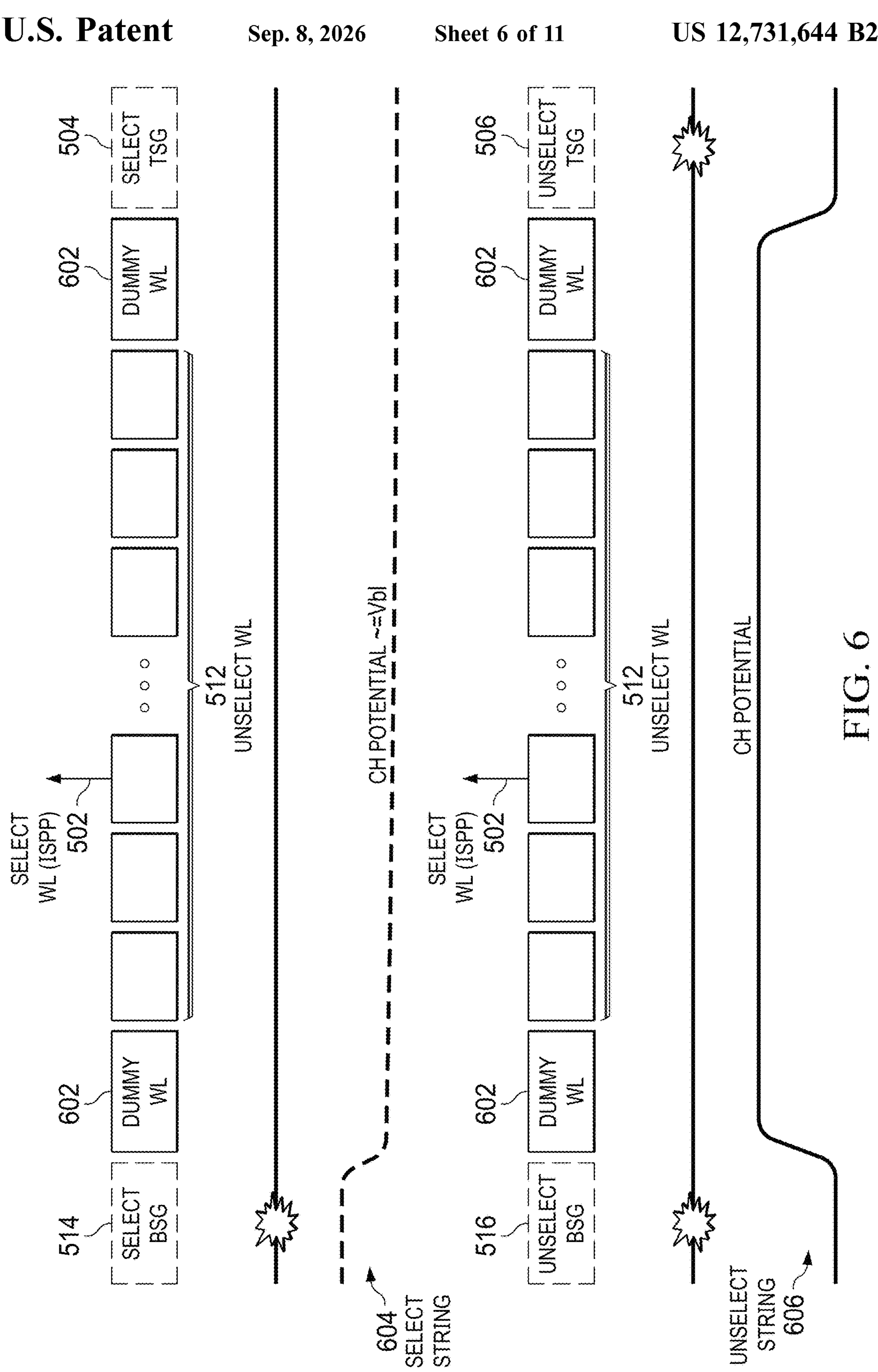
FIG. 6 illustrates example channel potentials associated with a selected string and an unselected string during a program operation, according to some aspects of the present disclosure.

FIG. 6 illustrates example channel potentials associated with a selected string and an unselected string during a program operation, according to some aspects of the present disclosure. In some implementations, sel. string 604 represents a memory string containing a memory cell selected for a program operation. Sel. string 604 can be an example of memory string 108 in FIG. 1. Sel. string 604 can couple to sel. BSG 514, sel. TSG 504, one or more dummy WL 602, sel. WL 502, and one or more unsel. WL 512. Dummy WL 602 represents a dummy word line in a memory cell block. As described in FIG. 5, during the program operation (e.g., between to and $t_2$ in FIG. 5), when unsel. BL 508 is first applied an over precharge voltage higher than Vinhibit (e.g., the dashed line for unsel. BL 508 in FIG. 5), then applied Vinhibit, the coupling effect between sel. BL 510 and unsel. BL 508 can reduce the floating voltage of sel. BL 510 from Vss (e.g., 0V) to a negative voltage (e.g., the dashed line for sel. BL 510 in FIG. 5). Because sel. BL 510 is coupled to the channel of sel. string 604, and because the one or more select gate transistors coupled to sel. TSG 504 are turned on (e.g., when sel. TSG 504 is applied a voltage Von, as shown in FIG. 5), the channel potential of sel. string 604 can reduce to a negative voltage corresponding to the negative voltage of sel. BL 510.

In some implementations, unsel. string 606 represents a memory string that does not contain any memory cells selected for a program operation. Unsel. string 606 can be an example of memory string 108 in FIG. 1. Unsel. string 606 can couple to unsel. BSG 516, unsel. TSG 506, one or more dummy WL 602, sel. WL 502, and one or more unsel. WL 512. As described in FIG. 5, during the program operation (e.g., between to and $t_2$ in FIG. 5), because the one or more select gate transistors coupled to unsel. TSG 506 are turned off, the channel potential of unsel. string 606 is not affected by the coupling effect between unsel. BL 508 and sel. BL 510, and can maintain a relatively high potential, as shown in FIG. 6.

Figure 7:
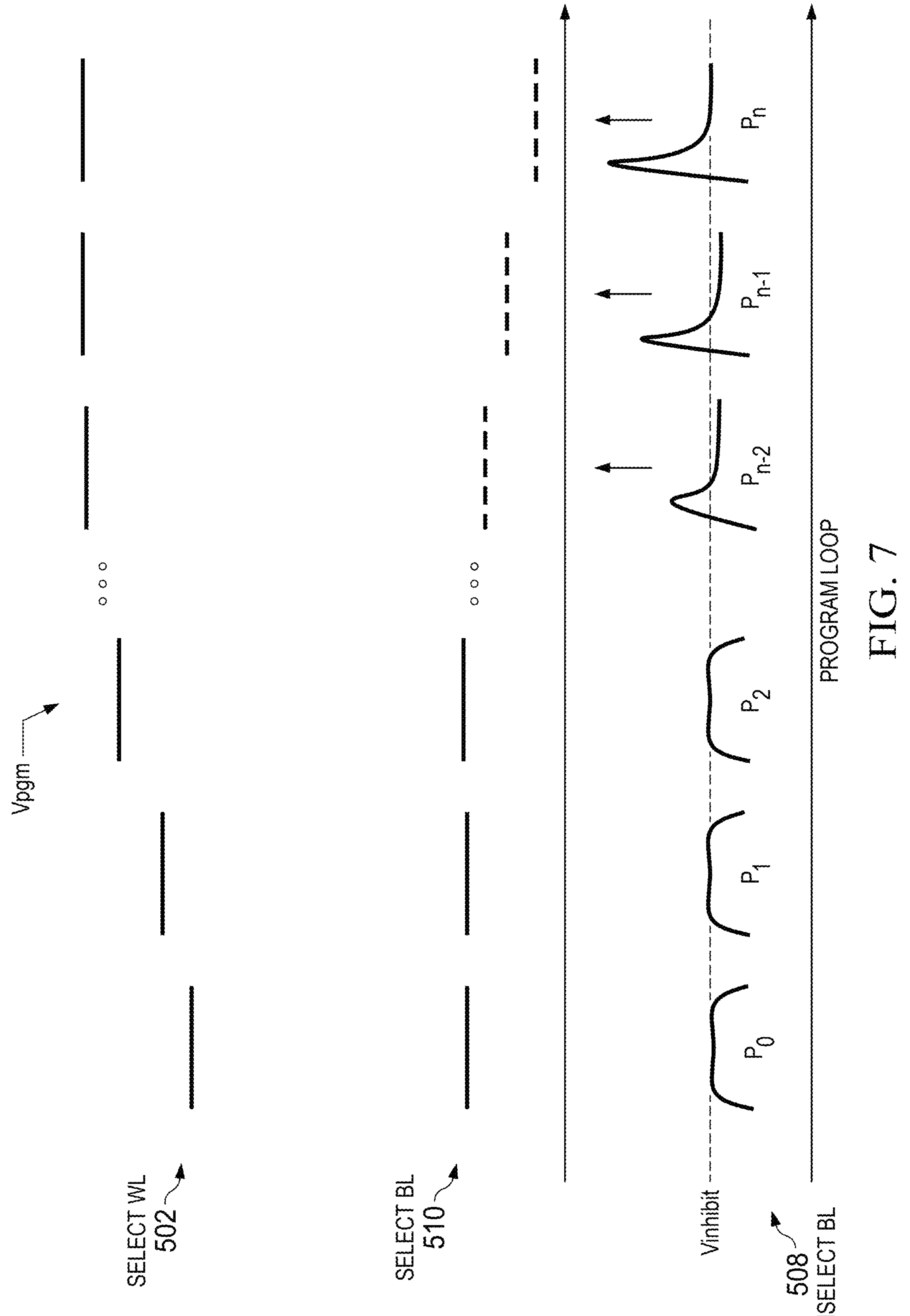
FIG. 7 illustrates example voltages of components in a memory cell block during a program operation, according to some aspects of the present disclosure.

FIG. 7 illustrates example voltages of components in a memory cell block during a program operation, according to some aspects of the present disclosure. As shown in FIG. 7, programming voltage Vpgm applied initially to sel. WL 502 during a program operation, for example, during each of the earlier program loops (e.g., $P_0, \ldots, P_{n-3}$) of the program operation, increases as the number of program loops increase. But Vpgm is kept constant among one or more latter program loops (e.g., the last couple of program loops (e.g., program loops $P_{n-2}$, $P_{n-1}$, and $P_n$)). On the other hand, unsel. BL 508 is applied Vinhibit initially during each program loop of the program operation, for example, during each of the earlier program loops $P_0, \ldots, P_{n-3}$, and is then applied a respective over precharge voltage higher than Vinhibit, followed by Vinhibit, during each of the last couple of program loops of the program operation, for example, during each of the latter program loops $P_{n-2}$, $P_{n-1}$, and $P_n$, as shown in FIG. 7. In some implementations, the respective over precharge voltage (e.g., fifth voltage or sixth voltage) for each of the last couple of program loops can increase as the number of program loops increases, as shown in FIG. 7 for program loops $P_{n-2}$, $P_{n-1}$, and $P_n$. In some cases, the difference in over precharge voltages between two consecutive program loops can increase or be kept constant as the number of program loops increases.

As shown in FIG. 7, due to the coupling effect between unsel. BL 508 and sel. BL 510, the floating voltage of sel. BL 510 gradually floats down across the last couple of program loops of the program operation, for example, across the program loops $P_{n-2}$, $P_{n-1}$, and $P_n$. Due to the coupling effect between sel. BL 510 and the channel of a memory string (e.g., a selected string) containing a memory cell selected for the program operation, the channel potential of the selected string also gradually floats down across the last couple of program loops of the program operation, corresponding to the trend in the lowered floating voltage of sel. BL 510 across the last couple of program loops of the program operation. Consequently, the difference between the channel potential of the selected string, for example, sel. string 604 in FIG. 6, and the programming voltage Vpgm of sel. WL 502 continues to increase across the last couple of program loops of the program operation, for example, across the program loops $P_{n-2}$, $P_{n-1}$, and $P_n$, as shown in FIG. 7. Therefore, during the last couple of program loops of the program operation, the programming efficiency of the memory cell coupled to sel. WL 502 and selected for the program operation is maintained, even though the programming voltage Vpgm is kept constant among the last couple of program loops to reduce the program disturbance in memory cells that are not selected for programming.

Additionally, as shown in FIG. 7, the floating voltage of sel. BL 510 remains unchanged initially during each program loop of the program operation, for example, during each of the program loops $P_0, \ldots, P_{n-3}$, because unsel. BL 508 is applied a constant Vinhibit initially during each program loop of the program operation, for example, during each of the program loops $P_0, \ldots, P_{n-3}$.

Figure 8:
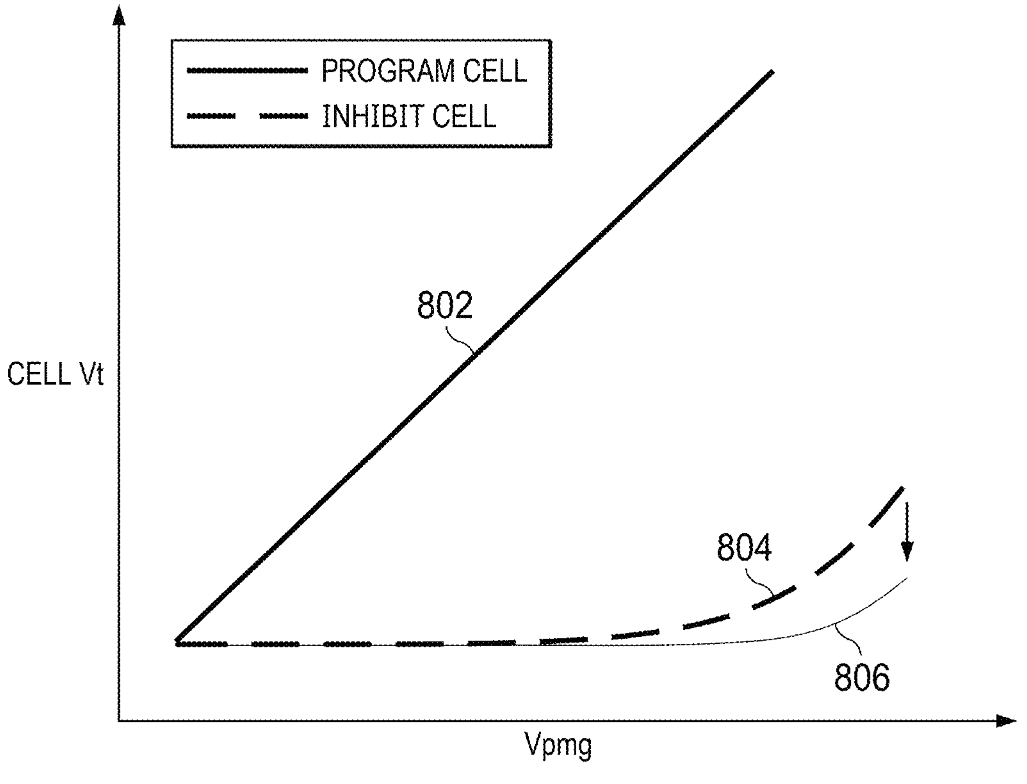
FIG. 8 illustrates example threshold voltages of two inhibit cells and a program cell, according to some aspects of the present disclosure.

FIG. 8 illustrates example threshold voltages of two inhibit cells and a program cell, according to some aspects of the present disclosure. Threshold voltage curve 802 represents the threshold voltage of a program cell (i.e., a cell selected for programming) as a function of programming voltage Vpgm, where Vpgm is applied to sel. WL 502 coupled to the program cell during a program operation. As shown in FIG. 8, the threshold voltage of the program cell increases (e.g., linearly) as a function of Vpgm.

Threshold voltage curve 804 represents the threshold voltage of an inhibit cell (i.e., a cell not selected for programming) as a function of Vpgm, when unsel. BL 508 is applied Vinhibit during each program loop in the program operation (e.g., as shown in the solid line for unsel. BL 508 in FIG. 5). As shown in FIG. 8, during the program operation of the program cell, when Vpgm continues to increase as the number of program loops in the program operation increases, the difference between Vpgm and the channel potential of the unselected string containing the inhibit cell increases. An example of the channel potential of an unselected string is the channel potential of unsel. string 606 in FIG. 6, which stays at a constant level. Therefore, as Vpgm continues to increase as the number of program loops in the program operation increases, the increased difference between Vpgm and the channel potential of the unselected string can increase the threshold voltage of the inhibit cell, and consequently result in program disturbance of the inhibit cell.

Threshold voltage curve 806 represents the threshold voltage of an inhibit cell as a function of Vpgm, when unsel. BL 508 is first applied the over precharge voltage higher than Vinhibit, then applied Vinhibit, during each of one or more last program loops in the program operation (e.g., as shown in the dashed line followed by the solid line for unsel. BL 508 in FIG. 5). Because Vpgm does not change among the last couple of program loops, for example, among program loops $P_{n-2}$, $P_{n-1}$, and $P_1$ in FIG. 7, the difference between Vpgm and the channel potential of the unselected string containing the inhibit cell does not change among the last few program loops. Therefore, for the last couple of program loops in the program operation, the difference between Vpgm and the channel potential of the unselected string only increase the threshold voltage of the inhibit cell slightly, and consequently the program disturbance of the inhibit cell is improved when compared to the case for threshold voltage curve 804.

Figure 9:
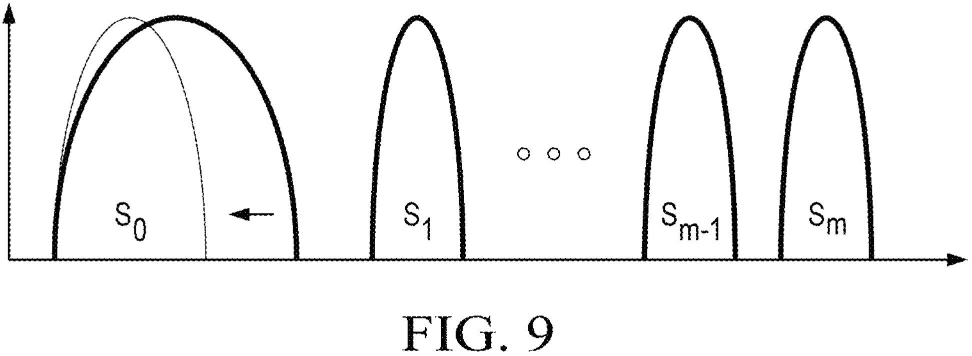
FIG. 9 illustrates example threshold voltage distributions of a memory cell, according to some aspects of the present disclosure.

FIG. 9 illustrates example threshold voltage distributions of a memory cell, according to some aspects of the present disclosure. FIG. 9 shows threshold voltage distributions for an erased state $S_0$ and programming states (also referred to as programming levels) $S_1$ to $S_m$. The two threshold voltage distributions for erased state $S_0$ in FIG. 9 correspond to the cases of threshold voltage curves 804 and 806 in FIG. 8 respectively, with the narrower threshold voltage distribution for $S_0$ in FIG. 9 corresponding to the case of threshold voltage curve 806 in FIG. 8, and the wider threshold voltage distribution for $S_0$ in FIG. 9 corresponding to the case of threshold voltage curve 804 in FIG. 8. The improvement from the wider threshold voltage distribution for $S_0$ to the narrower threshold voltage distribution for $S_0$ can be attributed to the same reason that leads to the improvement in program disturbance of an inhibit cell in FIG. 8 described above. As shown in FIG. 9, the improvement of the threshold voltage distribution for erased state $S_0$ results in increased read window between $S_0$ and each of the programming states $S_1$ to $S_m$.

Figure 10:
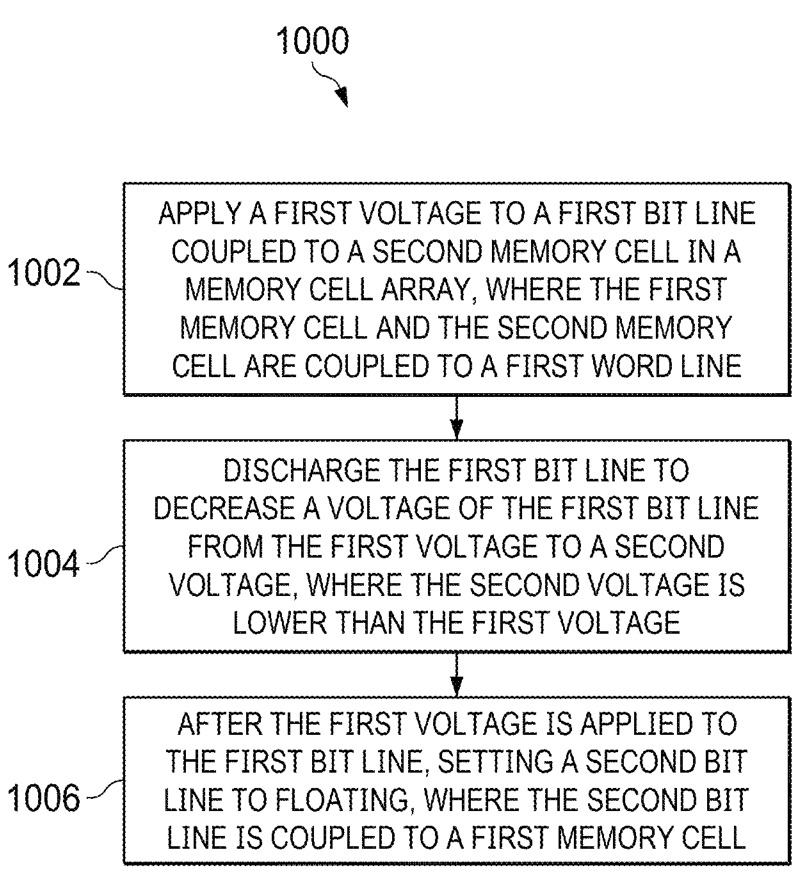
FIG. 10 is a flow chart of an example process for reducing program disturbance in a memory device, according to some aspects of the present disclosure.

FIG. 10 is a flow chart of an example process 1000 for reducing program disturbance in a memory device, according to some aspects of the present disclosure. Process 1000 can be performed by any suitable device or system as described herein, for example, according to the example techniques described with respect to FIGS. 4-7. For example, process 1000 can be performed by a memory device, such as memory device 100. The memory device can include a memory cell array, such as, memory cell array 101, and a peripheral circuit 102. The memory device can be a part of a memory system, such as memory system 1102. The operations shown in process 1000 may not be exhaustive and that other operations can be performed as well before, after, or in between any of the illustrated operations. Further, some of the operations may be performed simultaneously, or in a different order than shown in FIG. 10. In some implementations, some of the operations may be performed by or one or more components of a device or a system, such as, a peripheral circuit of the memory device.

In some implementations, process 1000 includes an example process for an n-th loop of a program operation performed on a first memory cell in the memory cell array. The first memory cell is a selected memory cell for programming into a programming state. In some implementations, the programming state of the first memory cell is the highest programming state among programming states of memory cells in the memory cell array (e.g., programming state $S_m$ in FIG. 9). In some implementations, the program operation can be an ISPP program operation, and the n-th loop of the program operation is the last loop of the ISPP program operation (e.g., loop $P_1$ in FIG. 4).

At 1002, a first voltage is applied to a first bit line coupled to a second memory cell in a memory cell array, where the first memory cell and the second memory cell are coupled to a first word line. In some implementations, the first voltage is an over precharge voltage higher than Vinhibit that is applied to an unselected bit line (e.g., unsel. BL 508) at the beginning of a program loop, for example, at to in FIG. 5, the first bit line is the unselected bit line (e.g., unsel. BL 508), the second memory cell is an unselected second memory cell (e.g., a memory cell coupled to unsel. BL 508), and the first word line is a word line coupled to a memory cell selected for a program operation (e.g., sel. WL 502).

At 1004, the first bit line is discharged to decrease a voltage of the first bit line from the first voltage to a second voltage, where the second voltage is lower than the first voltage. In some implementations, the second voltage is a voltage (e.g., Vinhibit in FIG. 5) that an unselected bit line (e.g., unsel. BL 508) is discharged to, after the unselected bit line is first applied an over precharge voltage higher than Vinhibit at the beginning of a program loop, for example, at to in FIG. 5.

At 1006, after the first voltage is applied to the first bit line, a second bit line is set to floating, where the second bit line is coupled to a first memory cell. In some implementations, the second bit line is a selected bit line coupled to a memory string that includes a memory cell selected for a program operation (e.g., sel. BL 510).

In some implementations, during an (n−i)-th loop and an (n−j)-th loop of the program operation, a same voltage is applied to the first word line, wherein i and j are two integers that are greater than zero and less than n, and i is greater than j. In some implementations, the (n−i)-th loop is program loop $P_{n-1}$ in FIG. 4, the (n−j)-th loop is program loop $P_{n-2}$ in FIG. 4, and the same voltage is the programming voltage of each of program pulses $G_{n-2}$ and $G_{n-1}$ in FIG. 4.

In some implementations, during a loop before the (n−i)-th loop of the program operation, the second voltage is applied to the first bit line, and a program voltage is applied to the first word line coupled to the first memory cell, wherein the program voltage is smaller than the same voltage applied during the (n−i)-th loop and the (n−j)-th loop. In some implementations, the loop before the (n−i)-th loop is program loop $P_2$ in FIG. 7, and the program voltage applied to the first word line is the program voltage applied during the program pulse in program loop $P_2$ in FIG. 7.

In some implementations, the second voltage is an inhibit voltage applied to the first bit line to inhibit programming of the second memory cell.

In some implementations, during the n-th loop, a third voltage is applied to a first select gate line coupled to a first select gate transistor to turn on the first select gate transistor, wherein the first memory cell and the first select gate transistor are coupled to the second bit line. In some implementations, the third voltage is a voltage (e.g., Von in FIG. 5) applied to a select gate line (e.g., sel. TSG 504) to turn on one or more select gate transistors coupled to the select gate line and to a memory cell selected for the program operation, and the first select gate line is a select gate line (e.g., sel. TSG 504).

In some implementations, a fourth voltage is applied to a second select gate line coupled to a second select gate transistor to turn off the second select gate transistor, wherein a third memory cell and the second select gate transistor are coupled to the second bit line, and the fourth voltage is lower than the third voltage. In some implementations, the fourth voltage is a voltage (e.g., Vss in FIG. 5) applied to an unselected gate line (e.g., unsel. TSG 506) during a program loop to turn off one or more select gate transistors coupled to the unselected gate line and to memory cells not selected for the program operation, and the second select gate line is an unselected gate line (e.g., unsel. TSG 506).

In some implementations, the fourth voltage is a negative voltage, for example, the voltage represented by the dashed line for unsel. TSG 506 in FIG. 5.

In some implementations, during an (n−1)-th loop of the program operation, a fifth voltage is applied to the first bit line, wherein the fifth voltage is lower than the first voltage. In some implementations, the (n−1)-th loop is program loop $P_{n-1}$ in FIG. 7, the fifth voltage is the over precharge voltage applied to unsel. BL 508 during program loop $P_{n-1}$, the n-th loop is program loop $P_1$ in FIG. 7, and the first voltage is the over precharge voltage applied to unsel. BL 508 during program loop $P_1$.

Figure 11:
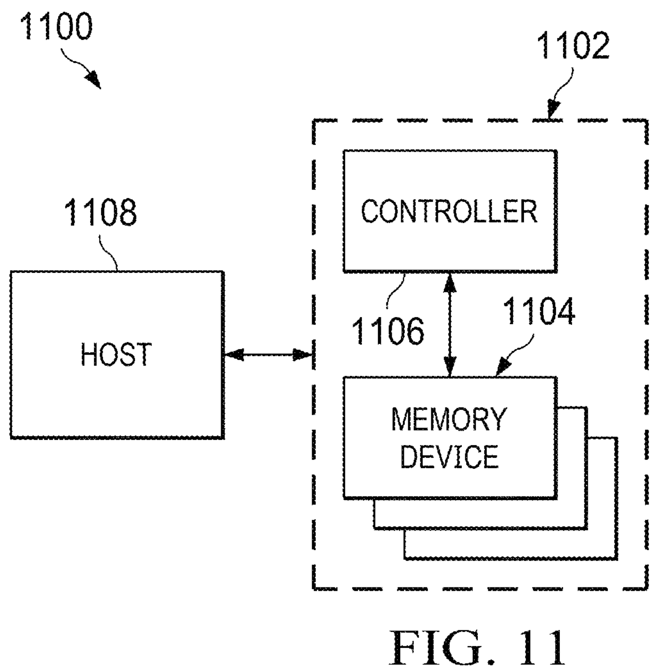
FIG. 11 illustrates a block diagram of an example system having a memory device, according to some aspects of the present disclosure.

FIG. 11 illustrates a block diagram of an example system 1100 having a memory device, according to some aspects of the present disclosure. System 1100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 11, system 1100 can include a host 1108 and a memory system 1102 having one or more memory devices 1104 and a memory controller 1106. Host 1108 can be a processor of an electronic device, such as a central processing unit (CPU), or a system-on-chip (SoC), such as an application processor (AP). Host 1108 can be configured to send or receive data to or from memory devices 1104.

Memory device 1104 can be any memory device disclosed in the present disclosure. Memory controller 1106 is coupled to memory device 1104 and host 1108 and is configured to control memory device 1104, according to some implementations. Memory controller 1106 can manage the data stored in memory device 1104 and communicate with host 1108. In some implementations, memory controller 1106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1106 can be configured to control operations of memory device 1104, such as read, erase, and program operations. Memory controller 1106 can also be configured to manage various functions with respect to the data stored or to be stored in memory device 1104 including, but not limited to bad-block management, garbage collection, logical-to-physical address conversion, wear leveling, etc. In some implementations, memory controller 1106 is further configured to process error correction codes (ECCs) with respect to the data read from or written to memory device 1104. Any other suitable functions may be performed by memory controller 1106 as well, for example, formatting memory device 1104.

Memory controller 1106 can communicate with an external device (e.g., host 1108) according to a particular communication protocol. For example, memory controller 1106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 12A:
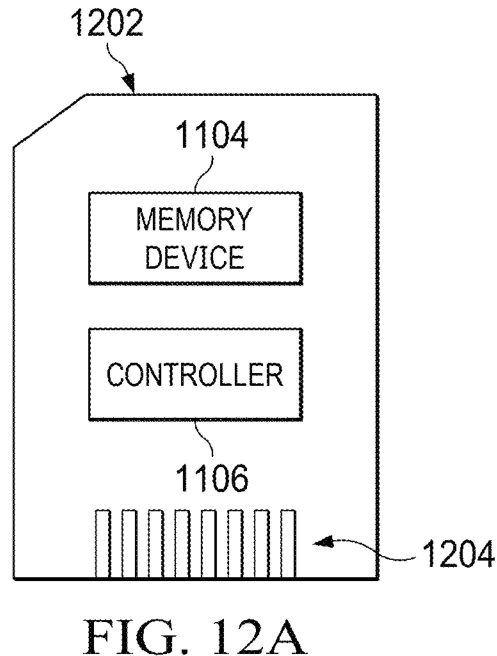
FIG. 12A illustrates a diagram of a memory card having a memory device, according to some aspects of the present disclosure.
Figure 12B:
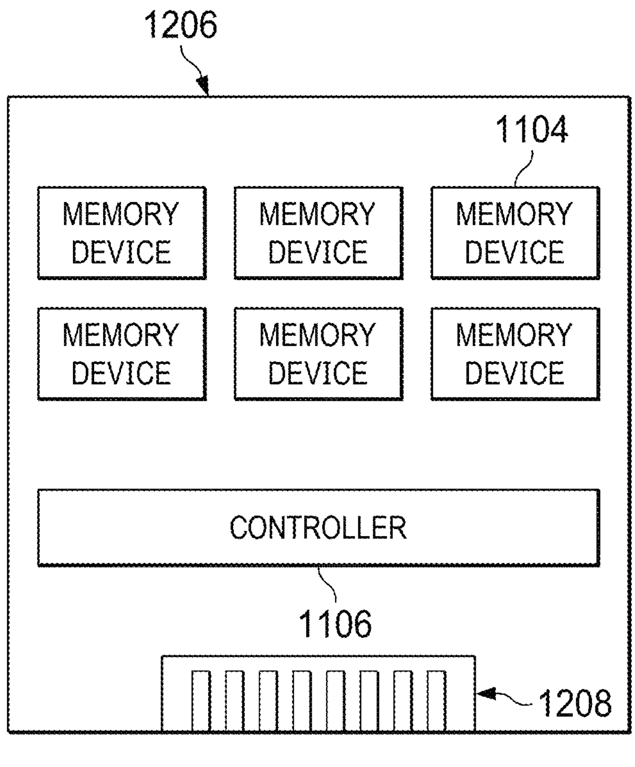
FIG. 12B illustrates a diagram of a solid-state drive (SSD) having a memory device, according to some aspects of the present disclosure.

Memory controller 1106 and one or more memory devices 1104 can be integrated into various types of storage devices, for example, be included in the same package, such as a universal Flash storage (UFS) package or an eMMC package. That is, memory system 1102 can be implemented and packaged into different types of end electronic products. In one example shown in FIG. 12A, memory controller 1106 and a single memory device 1104 may be integrated into a memory card 1202. Memory card 1202 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 1202 can further include a memory card connector 1204 coupling memory card 1202 with a host (e.g., host 1108 in FIG. 11). In another example shown in FIG. 12B, memory controller 1106 and multiple memory devices 1104 may be integrated into an SSD 1206. SSD 1206 can further include an SSD connector 1208 coupling SSD 1206 with a host (e.g., host 1108 in FIG. 11). In some implementations, the storage capacity and/or the operation speed of SSD 1206 is greater than those of memory card 1202.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A memory device, comprising:

a memory cell array; and a peripheral circuit coupled to the memory cell array and configured to:

during an n-th loop of a program operation performed on a first memory cell in the memory cell array:

apply a first voltage to a first bit line coupled to a second memory cell in the memory cell array, wherein the first memory cell and the second memory cell are coupled to a first word line;

discharge the first bit line to decrease a voltage of the first bit line from the first voltage to a second voltage, wherein the second voltage is lower than the first voltage; and after the first voltage is applied to the first bit line, set a second bit line to floating, wherein the second bit line is coupled to the first memory cell, and wherein the n-th loop is a last loop of the program operation and a programming state of the first memory cell is a highest programming state among programming states of memory cells in the memory cell array.

2. The memory device according to claim 1, wherein the peripheral circuit is further configured to:

during an (n−i)-th loop and an (n−j)-th loop of the program operation, apply a same voltage to the first word line, wherein i and j are two integers that are greater than zero and less than n, and i is greater than j.

3. The memory device according to claim 2, wherein the peripheral circuit is further configured to:

during a loop before the (n−i)-th loop of the program operation:

apply the second voltage to the first bit line; and apply a program voltage to the first word line coupled to the first memory cell, wherein the program voltage is smaller than the same voltage applied during the (n−i)-th loop and the (n−j)-th loop.

4. The memory device according to claim 1, wherein the second voltage is an inhibit voltage applied to the first bit line to inhibit programming of the second memory cell.

5. The memory device according to claim 1, wherein the peripheral circuit is further configured to:

during the n-th loop, apply a third voltage to a first select gate line coupled to a first select gate transistor to turn on the first select gate transistor, wherein the first memory cell and the first select gate transistor are coupled to the second bit line.

6. The memory device according to claim 5, wherein the peripheral circuit is further configured to:

apply a fourth voltage to a second select gate line coupled to a second select gate transistor to turn off the second select gate transistor, wherein a third memory cell and the second select gate transistor are coupled to the second bit line, and the fourth voltage is lower than the third voltage.

7. The memory device according to claim 6, wherein the fourth voltage is a negative voltage.

8. The memory device according to claim 1, wherein the peripheral circuit is further configured to:

apply, during an (n−1)-th loop of the program operation, a fifth voltage to the first bit line, wherein the fifth voltage is lower than the first voltage.

9. The memory device according to claim 8, wherein a difference between the fifth voltage and the first voltage is the same as or larger than a program voltage difference between the n-th loop and the (n−1)-th loop of the program operation.

10. The memory device according to claim 8, wherein the peripheral circuit is further configured to:

apply, during an (n−2)-th loop of the program operation, a sixth voltage to the first bit line, wherein the sixth voltage is lower than the fifth voltage, and a difference between the fifth voltage and the sixth voltage is lower than or equal to a difference between the first voltage and the fifth voltage.

11. The memory device according to claim 2, wherein the same voltage is applied to the first word line during last two or more loops of the program operation.

12. A method, comprising:

during an n-th loop of a program operation performed on a first memory cell in a memory cell array:

applying a first voltage to a first bit line coupled to a second memory cell in the memory cell array, wherein the first memory cell and the second memory cell are coupled to a first word line;

discharging the first bit line to decrease a voltage of the first bit line from the first voltage to a second voltage, wherein the second voltage is lower than the first voltage; and after the first voltage is applied to the first bit line, setting a second bit line to floating, wherein the second bit line is coupled to the first memory cell, and wherein the n-th loop is a last loop of the program operation and a programming state of the first memory cell is a highest programming state among programming states of memory cells in the memory cell array.

13. The method according to claim 12, further comprising:

during an (n−i)-th loop and an (n−j)-th loop of the program operation, applying a same voltage to the first word line, wherein i and j are two integers that are greater than zero and less than n, and i is greater than j.

14. The method according to claim 13, further comprising:

during a loop before the (n−i)-th loop of the program operation:

applying the second voltage to the first bit line; and applying a program voltage to the first word line coupled to the first memory cell, wherein the program voltage is smaller than the same voltage applied during the (n−i)-th loop and the (n−j)-th loop.

15. A memory system, comprising:

a memory device, comprising:

a memory cell array; and a peripheral circuit coupled to the memory cell array and configured to perform operations comprising:

during an n-th loop of a program operation performed on a first memory cell in the memory cell array:

applying a first voltage to a first bit line coupled to a second memory cell in the memory cell array, wherein the first memory cell and the second memory cell are coupled to a first word line;

discharging the first bit line to decrease a voltage of the first bit line from the first voltage to a second voltage, wherein the second voltage is lower than the first voltage; and after the first voltage is applied to the first bit line, setting a second bit line to floating, wherein the second bit line is coupled to the first memory cell; and a controller coupled to the memory device and configured to send one or more signals to the memory device to initiate the operations, and wherein the n-th loop is a last loop of the program operation and a programming state of the first memory cell is a highest programming state among programming states of memory cells in the memory cell array.

16. The memory system according to claim 15, wherein the operations further comprise:

during an (n−i)-th loop and an (n−j)-th loop of the program operation, applying a same voltage to the first word line, wherein i and j are two integers that are greater than zero and less than n, and i is greater than j.

17. The memory system according to claim 16, wherein the operations further comprise:

during a loop before the (n−i)-th loop of the program operation:

applying the second voltage to the first bit line; and applying a program voltage to the first word line coupled to the first memory cell, wherein the program voltage is smaller than the same voltage applied during the (n−i)-th loop and the (n−j)-th loop.

18. The memory system according to claim 15, wherein the second voltage is an inhibit voltage applied to the first bit line to inhibit programming of the second memory cell.

19. The memory system according to claim 15, wherein the peripheral circuit is further configured to:

during the n-th loop, apply a third voltage to a first select gate line coupled to a first select gate transistor to turn on the first select gate transistor, wherein the first memory cell and the first select gate transistor are coupled to the second bit line.

20. The memory system according to claim 19, wherein the peripheral circuit is further configured to:

apply a fourth voltage to a second select gate line coupled to a second select gate transistor to turn off the second select gate transistor, wherein a third memory cell and the second select gate transistor are coupled to the second bit line, and the fourth voltage is lower than the third voltage.

* * * * *